(12) United States Patent
Kwon

(10) Patent No.: US 8,039,839 B2
(45) Date of Patent: Oct. 18, 2011

(54) ORGANIC LIGHT EMITTING DIODE DISPLAY DEVICE AND METHOD OF FABRICATING THE SAME

(75) Inventor: Jung-Hyun Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 205 days.

(21) Appl. No.: 12/321,747

(22) Filed: Jan. 23, 2009

(65) Prior Publication Data

US 2009/0194780 A1 Aug. 6, 2009

(30) Foreign Application Priority Data

Jan. 31, 2008 (KR) .................. 10-2008-0010244

(51) Int. Cl.
H01L 29/04 (2006.01)

(52) U.S. Cl. .................. 257/59; 257/72; 257/258

(58) Field of Classification Search .......... 257/59, 257/72, 258
See application file for complete search history.

(56) References Cited

U.S. PATENT DOCUMENTS

| | | | |
|---|---|---|---|
| 2003/0189400 A1 | 10/2003 | Nishio et al. | |
| 2004/0119419 A1 | 6/2004 | Kai et al. | |
| 2005/0285114 A1* | 12/2005 | Kang et al. | 257/72 |
| 2006/0097263 A1 | 5/2006 | Lee et al. | |
| 2007/0190673 A1 | 8/2007 | Ko et al. | |
| 2008/0018229 A1 | 1/2008 | Yamazaki | |

FOREIGN PATENT DOCUMENTS

| | | |
|---|---|---|
| CN | 1773716 A | 5/2006 |
| CN | 1941400 A | 4/2007 |
| EP | 1 482 572 A1 | 12/2004 |
| EP | 1 942 526 A2 | 7/2008 |
| JP | 07-270806 | 10/1995 |
| JP | 2003-347041 A | 12/2003 |
| JP | 2004-047458 A | 2/2004 |
| JP | 2005-505114 | 2/2005 |
| JP | 2005-510035 | 4/2005 |

(Continued)

OTHER PUBLICATIONS

SIPO Office action dated Mar. 24, 2010, for corresponding Chinese Patent application 200910005969.7, noting listed references in this IDS, as well as KR 10-0796618 previously filed in an IDS dated Jul. 15, 2009.

(Continued)

*Primary Examiner* — Tan N Tran

(74) *Attorney, Agent, or Firm* — Christie, Parker & Hale, LLP

(57) ABSTRACT

An organic light emitting diode (OLED) display device and a method of fabricating the same are provided. When an organic layer having an emission layer (EML) is formed using a deposition mask, damage to a pixel defining layer due to inconsistencies or unevenness of the deposition mask is prevented or reduced using spherical spacers disposed on the pixel defining layer. A plurality of spherical spacers are applied on the pixel defining layer prior to forming an opening in the pixel defining layer exposing the first electrode. An organic layer having an emission layer (EML) is formed on the first electrode at the opening by using a deposition mask. The spherical spacers prevent or reduce damage to the pixel defining layer caused by inconsistencies or unevenness in the deposition mask by maintaining a spacing between the pixel defining layer and the deposition mask.

16 Claims, 11 Drawing Sheets

FOREIGN PATENT DOCUMENTS

| | | |
|---|---|---|
| JP | 2005-174907 | 6/2005 |
| JP | 2005-322564 | 11/2005 |
| JP | 2006-126817 | 5/2006 |
| JP | 2006-140145 | 6/2006 |
| KR | 2003-0083153 | 10/2003 |
| KR | 10-2005-0030296 * | 3/2005 |
| KR | 10-2005-0030296 A | 3/2005 |
| KR | 10-2006-0004476 | 1/2006 |
| KR | 10-2006-0051830 | 5/2006 |
| KR | 10-0708734 | 4/2007 |
| KR | 10-0793546 B1 | 1/2008 |
| KR | 10-0796618 | 1/2008 |

OTHER PUBLICATIONS

European Search Report dated Apr. 21, 2009, for corresponding European application 09150625.3, noting listed references in this IDS.

European Search Report dated Apr. 23, 2009, for European application 08250031.9, corresponding to related U.S. Appl. No. 12/006,666, noting listed references in this IDS.

Chinese Office action dated Jun. 12, 2009, for related Chinese application 200810015069, noting listed reference in this IDS.

KIPO Office action dated Aug. 20, 2009, for priority Korean application 10-2008-0010244, noting the cited references in this IDS.

* cited by examiner

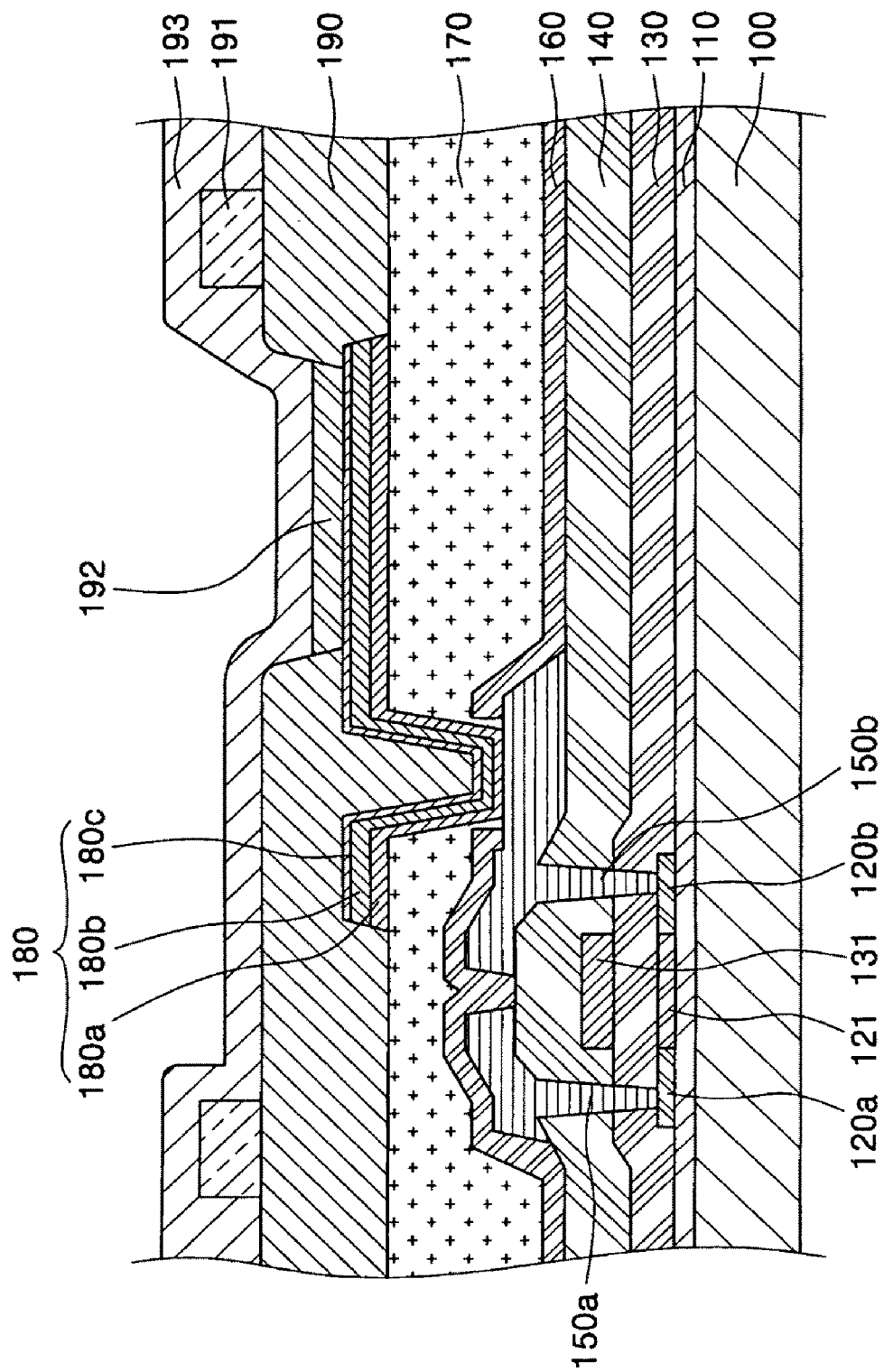

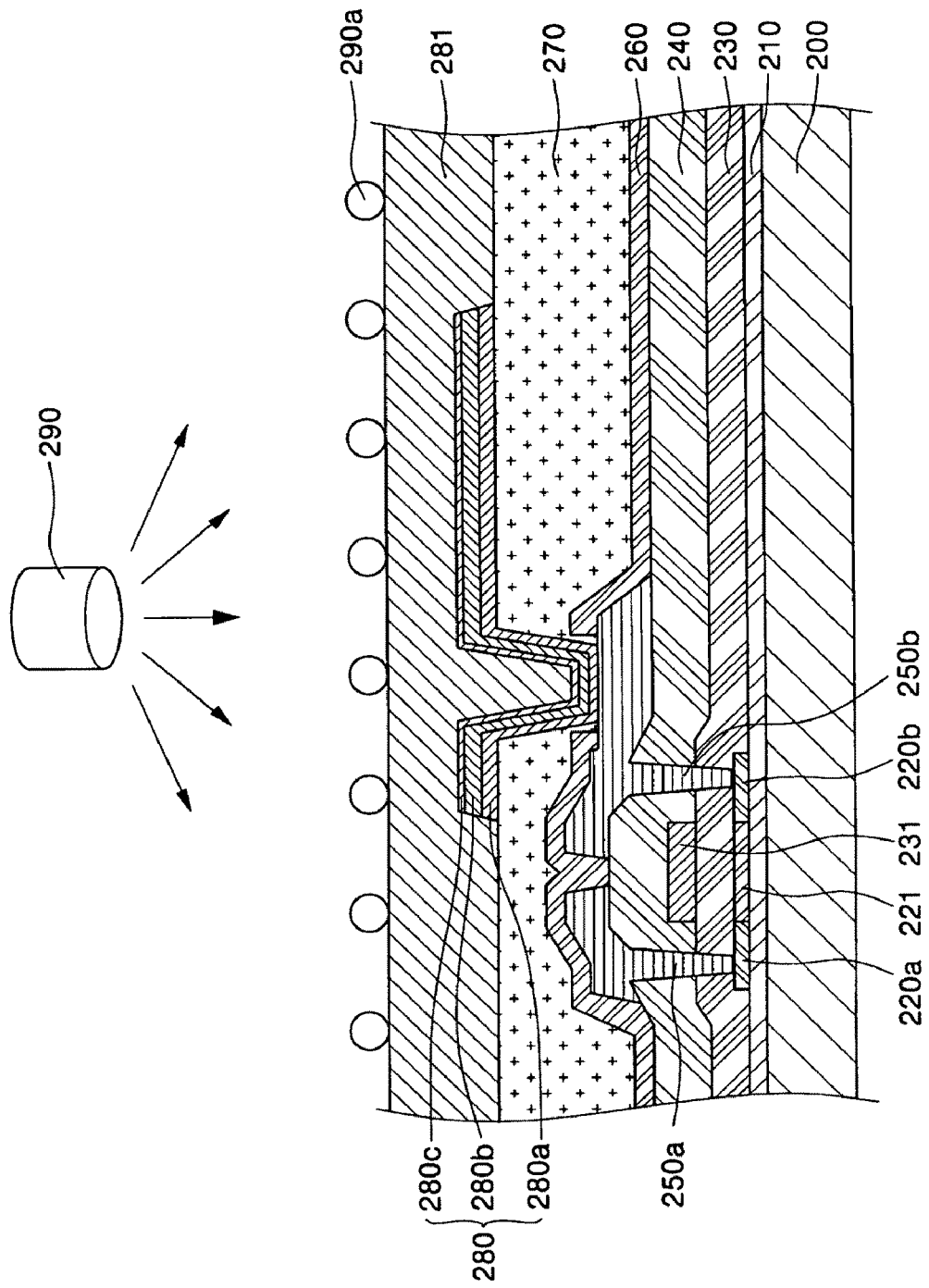

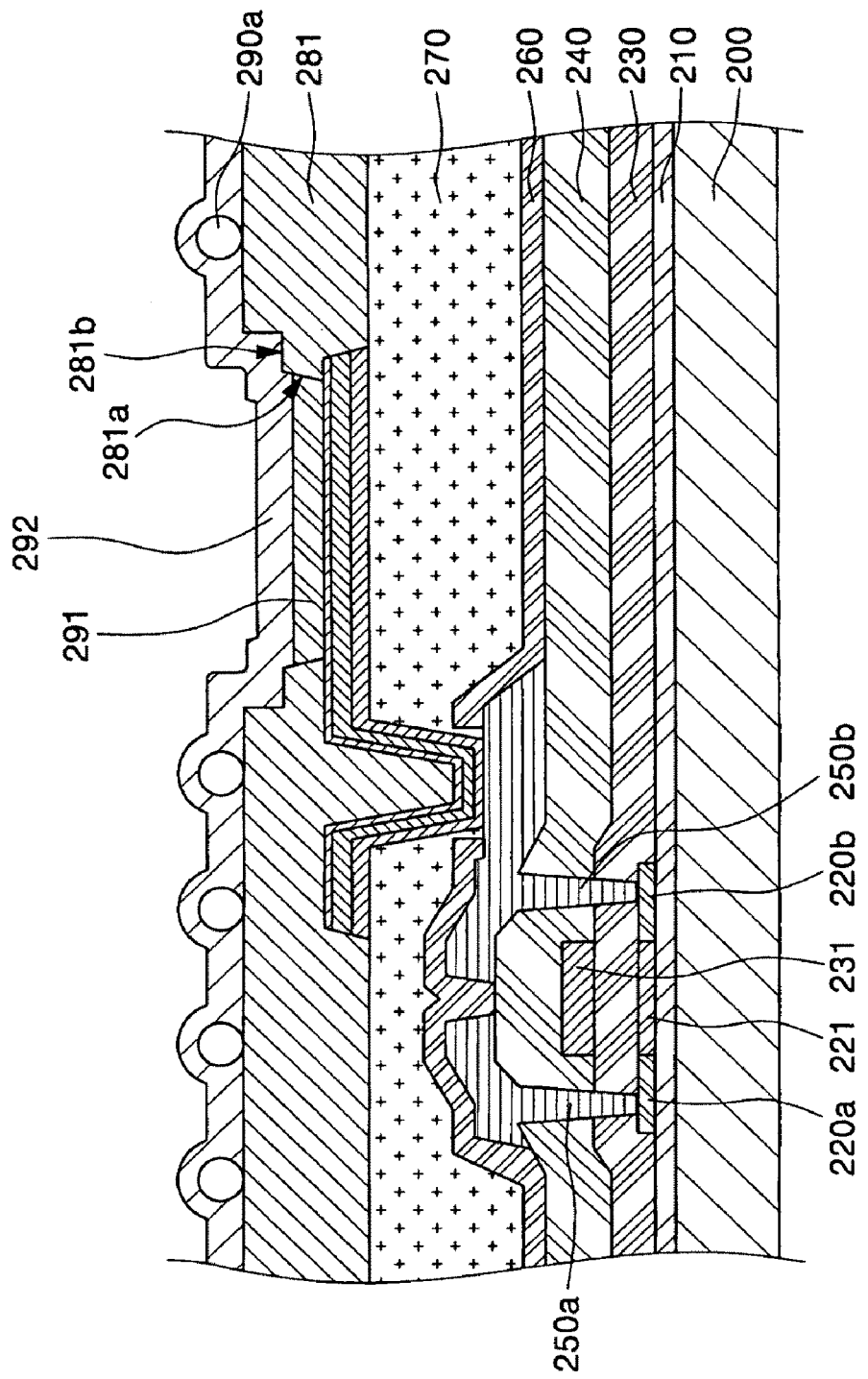

though the present invention. Embodiments of the present invention are described below.

ORGANIC LIGHT EMITTING DIODE DISPLAY DEVICE AND METHOD OF FABRICATING THE SAME

CROSS-REFERENCE TO RELATED APPLICATION

This application claims the priority of and the benefit of Korean Patent Application No. 2008-10244, filed Jan. 31, 2008, the disclosure of which is hereby incorporated herein by reference in its entirety.

BACKGROUND OF THE INVENTION

1. Field of the Invention

The present invention relates to an organic light emitting diode (OLED) display device and a method of fabricating the same.

2. Description of the Related Art

In general, an organic light emitting diode (OLED) includes an organic layer interposed between a first electrode (i.e., an anode) and a second electrode (i.e., a cathode). The first electrode is a transparent electrode formed of, for example, indium tin oxide (ITO), and the second electrode is formed of a metal having a low work function, such as Ca, Li, or Al. When a forward voltage is applied to the OLED, holes emitted from the anode combine with electrons emitted from the cathode to form excitons, and while the excitons are making the transition from an excited state to a ground state, light is emitted.

The first electrode is generally formed as a reflective electrode that reflects light, while the second electrode is generally formed as a transmissive electrode that transmits light. Thus, the OLED may be fabricated so that light is emitted by the organic layer toward the second electrode.

In this case, the organic layer may be formed by various methods. For example, the organic layer may be formed by a deposition method. Specifically, the deposition of the organic layer includes closely adhering a mask having the same pattern as a thin layer to be formed on an underlying layer, and depositing the thin layer.

FIG. 1 is a cross-sectional schematic view of a deposition apparatus having a deposition mask.

Referring to FIG. 1, in a method of depositing a thin layer of an OLED display device (i.e., an organic layer having an emission layer (EML)), a frame 4 including a mask 1 is positioned at a portion corresponding to a crucible 3 installed in a vacuum chamber 2, and a target 5 (e.g., a pixel defining layer) on which a thin layer will be formed is mounted on the frame 4. A magnet unit 6 is driven to closely adhere the mask 1 and frame 4 to the target 5 on which the thin layer will be formed. A material contained in the crucible 3 is then deposited on the target 5.

However, the surface of the mask 1 may include inconsistencies (or unevenness) of about 2 to 3 μm. Thus, when the mask 1 is too closely adhered to the target 5, the target 5 may be scratched from the inconsistencies in the mask 1. Accordingly, a spacer structure is typically formed between the target 5 and the mask 1 in order to prevent damage to the pixel defining layer.

FIGS. 2A and 2B are cross-sectional schematic views illustrating a method of fabricating a conventional OLED display device.

Referring to FIG. 2A, a buffer layer 110 is formed on a substrate 100. A semiconductor layer including source and drain regions 120a and 120b and a channel region 121 is formed on the buffer layer 110. A gate insulating layer 130 is formed on the semiconductor layer, and a gate electrode 131 is formed on the gate insulating layer 130. An interlayer insulating layer 140 is formed on the gate insulating layer 130, and source and drain electrodes 150a and 150b are formed on the interlayer insulating layer 140 and electrically connected to the source and drain regions 120a and 120b, respectively, through contact holes.

An OLED is then formed. The OLED includes a first electrode 180 and a pixel defining layer 190. The first electrode 180 is formed on a protective layer 160 and a planarization layer 170, which are, in turn, formed on a thin film transistor (TFT). The first electrode 180 functions as an anode that is electrically connected to the drain electrode 150b through a via hole. The pixel defining layer 190 exposes a region of the first electrode 180, and has an opening defining a pixel.

A spacer film is coated on the pixel defining layer 190, and a photoresist layer is formed on the spacer film, and exposed and developed using a shadow mask, thereby forming a photoresist pattern. Thereafter, the spacer film is patterned using the photoresist pattern as a mask, forming a spacer pattern 191.

Referring to FIG. 2B, an organic layer 192 having an EML is formed using the deposition apparatus having the deposition mask, described above with reference to FIG. 1. A second electrode 193 is formed on the organic layer 192 using a sputtering process. In this case, when the organic layer 192 is formed using the deposition apparatus, the spacer pattern prevents or protects the pixel defining layer 190 from being damaged from inconsistencies in the deposition mask.

However, in this conventional method of fabricating the OLED display device, an extra photolithography process for forming the spacer pattern is added, and additional material costs for the spacer film are incurred.

Furthermore, since the spacer pattern is formed by patterning the spacer film using the photolithography process, a residual layer of the spacer film may remain on the first electrode.

SUMMARY OF THE INVENTION

Aspects of embodiments of the present invention are directed toward an organic light emitting diode (OLED) display device and a method of fabricating the same, in which when an organic layer having an emission layer (EML) is formed using a deposition mask, damage to a pixel defining layer due to the unevenness of the deposition mask is prevented or reduced using spherical spacers disposed on the pixel defining layer, so that a conventional photolithography process for forming a spacer pattern is omitted.

According to an embodiment of the present invention, an OLED display device includes: a substrate; a first electrode on the substrate; a pixel defining layer on the first electrode, the pixel defining layer including an opening exposing the first electrode and a nonopening separated into a first region having a first level and a second region having a second level; a plurality of spherical spacers on the second region of the pixel defining layer; an organic layer on the first electrode and including an emission layer (EML); and a second electrode on the organic layer, wherein the first region is located along an edge portion of the opening.

The first level may be lower than the second level.

The width of the first region may be at least ½ the size of each of the spherical spacers.

Each of the spherical spacers may have a size of about 3 to 10 μm.

According to another embodiment of the present invention, a method of fabricating an OLED display device includes:

providing a substrate; forming a first electrode on the substrate; forming a pixel defining layer on the first electrode; applying a plurality of spherical spacers on the pixel defining layer; forming an opening in the pixel defining layer partially exposing the first electrode and a nonopening separated into a first region having a first level and a second region having a second level on the pixel defining layer; forming an organic layer having an emission layer (EML) on the first electrode; and forming a second electrode on the organic layer, wherein the first region is formed along an edge portion of the opening.

After forming the pixel defining layer, the method may further include exposing the pixel defining layer to light to form the opening and the first and second regions in the pixel defining layer.

The process of exposing the pixel defining layer to light may be performed using a halftone mask.

The halftone mask includes a light blocking region, a semi-transmissive region, and a transmissive region. When the pixel defining layer is formed of a positive material, the opening may correspond to the transmissive region, the first region may correspond to the semi-transmissive region, and the second region may correspond to the light blocking region. When the pixel defining layer is formed of a negative material, the opening may correspond to the light blocking region, the first region may correspond to the semi-transmissive region, and the second region may correspond to the transmissive region.

After applying the spherical spacers, the method may further include baking the substrate with the spherical spacers. The baking process may be performed at a temperature of about 50 to 200° C.

BRIEF DESCRIPTION OF THE DRAWINGS

The accompanying drawings, together with the specification, illustrate exemplary embodiments of the present invention, and, together with the description, serve to explain the principles of the present invention.

FIGS. 2A and 2B are cross-sectional schematic views illustrating a method of fabricating a conventional organic light emitting diode (OLED) display device;

FIGS. 4A through 4E are cross-sectional schematic views illustrating a method of fabricating an OLED display device according to an exemplary embodiment of the present invention;

DETAILED DESCRIPTION

Figure 1:
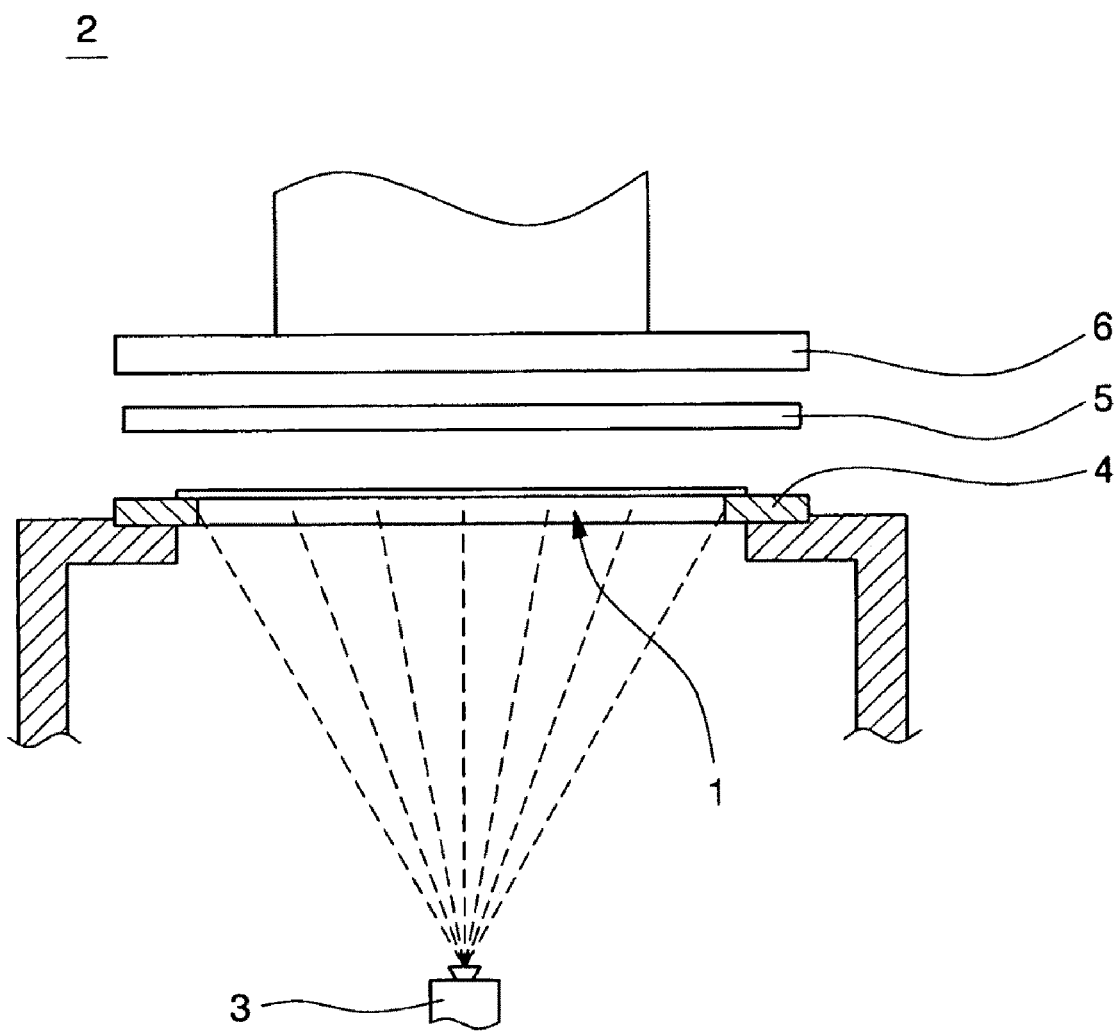
FIG. 1 is a cross-sectional schematic view of a conventional deposition apparatus having a deposition mask.
Figure 2A:
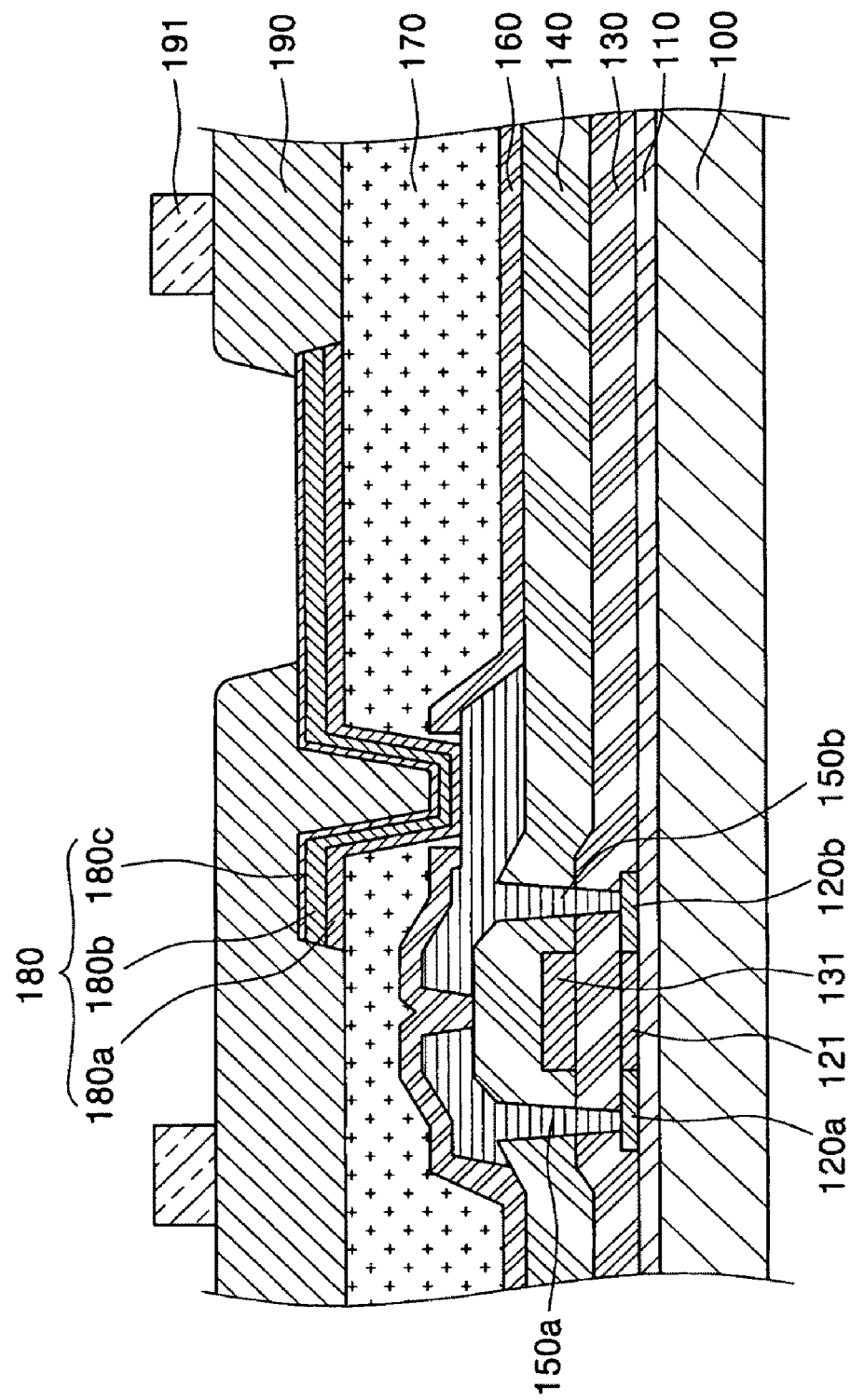

In the following detailed description, only certain exemplary embodiments of the present invention are shown and described, by way of illustration. As those skilled in the art would recognize, the invention may be embodied in many different forms and should not be construed as being limited to the embodiments set forth herein. Furthermore, in the context of the present application, when an element is referred to as being "on" another element, it can be directly on the another element or be indirectly on the another element with one or more intervening elements interposed therebetween. Like reference numerals designate like elements throughout the specification.

Figure 3:
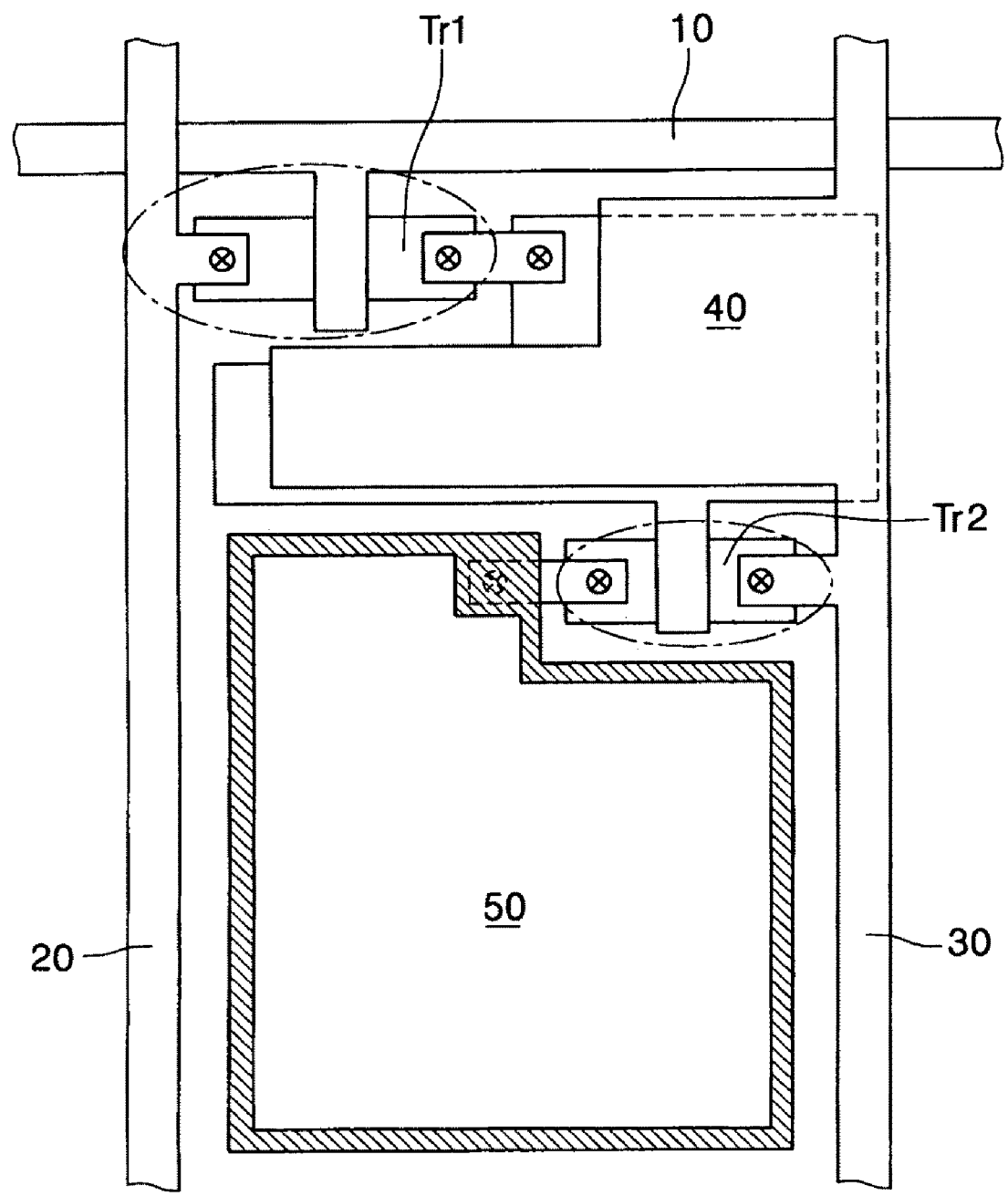
FIG. 3 is a plan schematic view of a unit pixel of a general OLED display device.

FIG. 3 is a plan schematic view of a unit pixel of a general organic light emitting diode (OLED) display device.

Referring to FIG. 3, the unit pixel includes a switching transistor Tr1, a driving transistor Tr2, a capacitor 40, and an OLED 50. A gate line 10, a data line 20, and a power supply line 30 are connected to respective components of the unit pixel.

The switching transistor Tr1 is driven in response to a scan signal applied to the gate line 10, and functions to transmit a data signal from data line 20 to the driving transistor Tr2.

The driving transistor Tr2 receives the data signal, receives a signal from the power supply line 30, and determines the amount of current flowing through the OLED 50 based on a gate-source voltage difference.

The capacitor 40 functions to store the data signal transmitted through the switching transistor Tr1 for each frame.

FIGS. 4A through 4E are cross-sectional schematic views illustrating a method of fabricating an OLED display device according to an exemplary embodiment of the present invention.

Figure 4A:
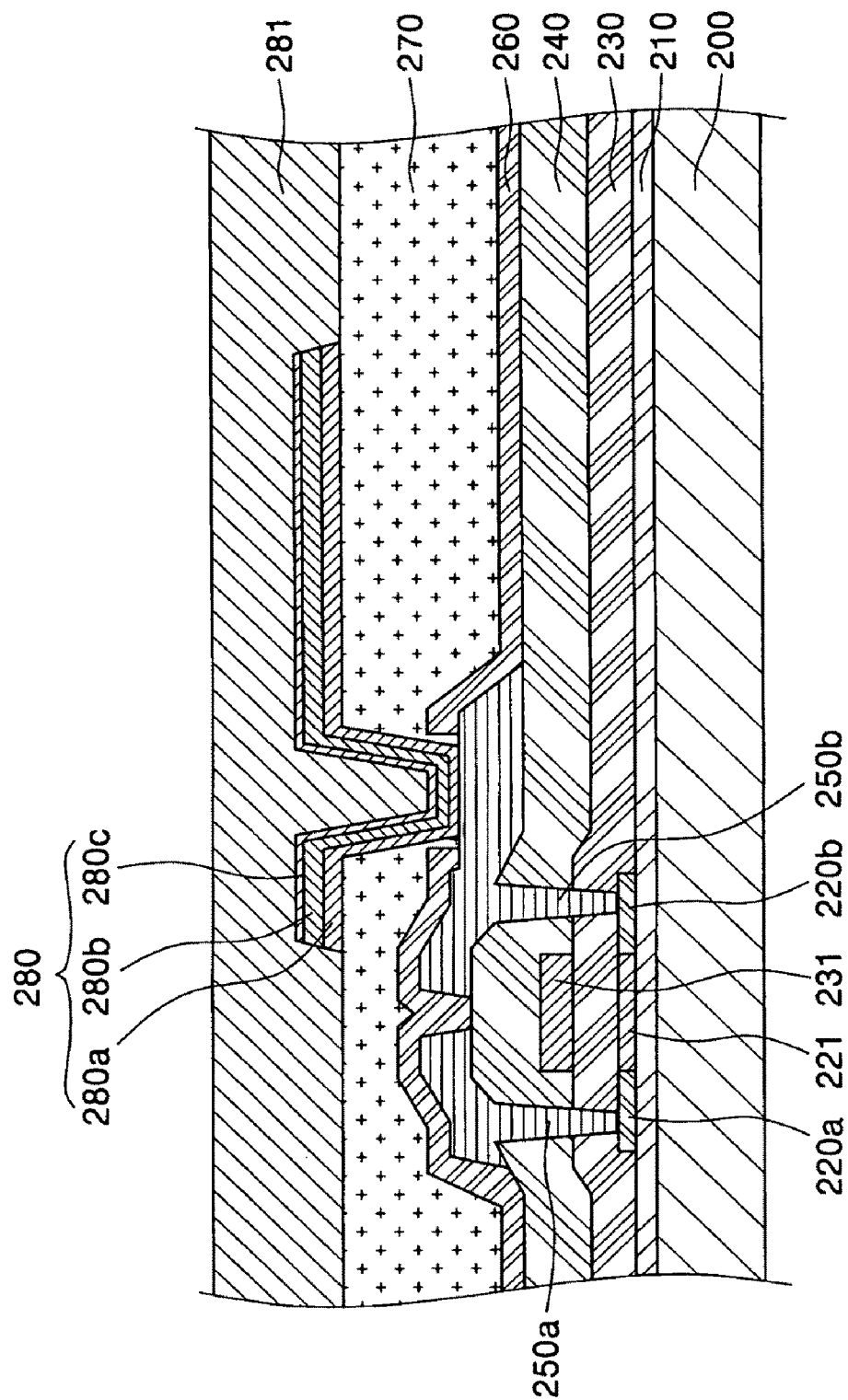

Referring to FIG. 4A, a buffer layer 210 is formed on the surface of a transparent insulating substrate 200. The buffer layer 210 is generally formed by depositing silicon oxide using a plasma-enhanced chemical vapor deposition (PECVD) process. In this case, the buffer layer 210 prevents or protects from the diffusion of impurities into the transparent insulating substrate 200 during crystallization of an amorphous silicon (a-Si) layer formed in a subsequent process.

An a-Si layer as a semiconductor layer is deposited on the buffer layer 210. After that, the a-Si layer is crystallized using, for example, an excimer laser annealing (ELA) process, a sequential lateral solidification (SLS) process, a metal induced crystallization (MIC) process, or a metal induced lateral crystallization (MILC) process, and may be patterned using photolithography and etching processes, forming a semiconductor layer pattern.

A gate insulating layer 230 is formed with the semiconductor layer pattern. In this case, the gate insulating layer 230 may be a silicon oxide ($SiO_2$) layer, a silicon nitride ($SiN_x$) layer, or a double layer thereof.

A gate electrode 231 is formed on the gate insulating layer 230 in a region corresponding to a channel region 221 of the semiconductor layer pattern. The gate electrode 231 may be formed of, for example, aluminum (Al), an Al alloy, molybdenum (Mo), or an Mo alloy.

Thereafter, impurity ions are implanted into the semiconductor layer pattern using the gate electrode 231 as an implantation mask, thereby forming source and drain regions 220a and 220b. In this case, the implantation process may be performed using n+ impurity ions or p+ impurity ions as a dopant.

Next, an interlayer insulating layer 240 is formed. The interlayer insulating layer 240 may be a silicon oxide ($SiO_2$) layer, a silicon nitride ($SiN_x$) layer, or a double layer thereof.

Thereafter, the interlayer insulating layer 240 and the gate insulating layer 230 are etched using photolithography and etching processes, forming contact holes exposing the source and drain regions 220a and 220b.

A source/drain electrode material is formed and etched using photolithography and etching processes, forming source and drain electrodes 250a and 250b connected to the source and drain regions 220a and 220b, respectively. The source/drain electrode material may be a single layer formed of, for example, Mo, W, MoW, AlNd, Ti, Al, an Al alloy, Ag, or an Ag alloy. Alternatively, in order to reduce interconnection resistance, the source/drain electrode material may be a multilayered structure utilizing a low-resistance material, for example, a stack structure of Mo/Al/Mo, MoW/Al—Nd/MoW, Ti/Al/Ti, Mo/Ag/Mo, or Mo/Ag-alloy/Mo.

An insulating layer is formed on the source and drain electrodes 250a and 250b. The insulating layer may be an inorganic layer 260, an organic layer 270, or a double layer thereof. A first electrode 280 is formed on the insulating layer, connecting to the source electrode 250a or the drain electrode 250b through a via hole formed in the insulating layer.

The first electrode 280 may be embodied as a transparent electrode when the OLED display device is a bottom-emitting type, or embodied as a reflective electrode when the OLED display device is a top-emitting type. When the first electrode 280 is embodied as a transparent electrode, the first electrode 280 may be formed of, for example, indium tin oxide (ITO), indium zinc oxide (IZO), tin oxide (TO), or zinc oxide (ZnO). When the first electrode 280 is embodied as a reflective electrode, the first electrode 280 may be formed by sequentially stacking a reflective layer and a transparent electrode. In this case, the reflective layer may be formed of, for example, Ag, Mg, Al, Pt, Pd, Au, Ni, Nd, Ir, Cr, or combinations thereof, and the transparent electrode may be formed of, for example, ITO, IZO, TO, or ZnO.

In another embodiment, when the OLED display device is a top-emitting type, the first electrode 280 may be formed by, for example, sequentially stacking a lower electrode layer 280a, a reflective electrode layer 280b, and an upper electrode layer 280c.

The lower electrode 280a may be formed of, for example, ITO, IZO, TO, or ZnO, and may have a thickness of about 50 to 100 Å. When the lower electrode layer 280a has a thickness of less than 50 Å, it may be difficult to form the lower electrode layer 280a to a uniform thickness. When the lower electrode layer 280a has a thickness of more than 100 Å, the adhesion of the lower electrode layer 280a to the reflective electrode layer 280b may weaken due to stress to the lower electrode layer 280a.

The reflective electrode layer 280b may be formed of, for example, Al, an Al alloy, Ag, or an Ag alloy, and may have a thickness of about 900 to 2000 Å. When the reflective electrode layer 280b has a thickness of less than 900 Å, light may be partially transmitted through the reflective electrode layer 280b. The reflective electrode layer 280b should have a thickness of about 1000 Å or more in order to prevent or block the transmission of light. Forming the reflective electrode layer 280b to a thickness of more than 2000 Å may be disadvantageous in terms of fabrication cost and process time.

The reflective electrode layer 280b functions to reflect light so as to increase luminance and luminous efficiency.

The upper electrode layer 280c may be formed of, for example, ITO, IZO, TO, or ZnO, and may have a thickness of about 50 to 100 Å. When the upper electrode layer 280c has a thickness of less than 50 Å, it may be difficult to form the upper electrode layer 280c with a uniform thickness. When the upper electrode layer 280c is formed to a thickness of more than 100 Å, the reflectance of a blue region may be reduced up to 15% or more due to an interference effect.

Thereafter, an insulating layer is formed on the first electrode 280. In this case, the insulating layer may be a pixel defining layer 281.

The pixel defining layer 281 may be formed of, for example, polyacrylates resin, epoxy resin, phenolic resin, polyamides resin, polyimides rein, unsaturated polyesters resin, poly(phenylenethers) resin, poly(phenylenesulfides) resin, or benzocyclobutene (BCB).

The pixel defining layer 281 may be formed of a positive material or a negative material.

A portion of a positive material irradiated with light softens during a photolithography process, so that the irradiated portion may be removed during a developing process. Conversely, a portion of negative material, irradiated with light hardens during a photolithography process so that an unirradiated portion may be removed during a developing process.

Thereafter, photolithography and etching processes are performed to develop an opening and nonopening in the pixel defining layer 281. The opening partially exposes the first electrode 280, and the nonopening is separated into a first region having a first level and a second region having a second level.

Figure 4B:
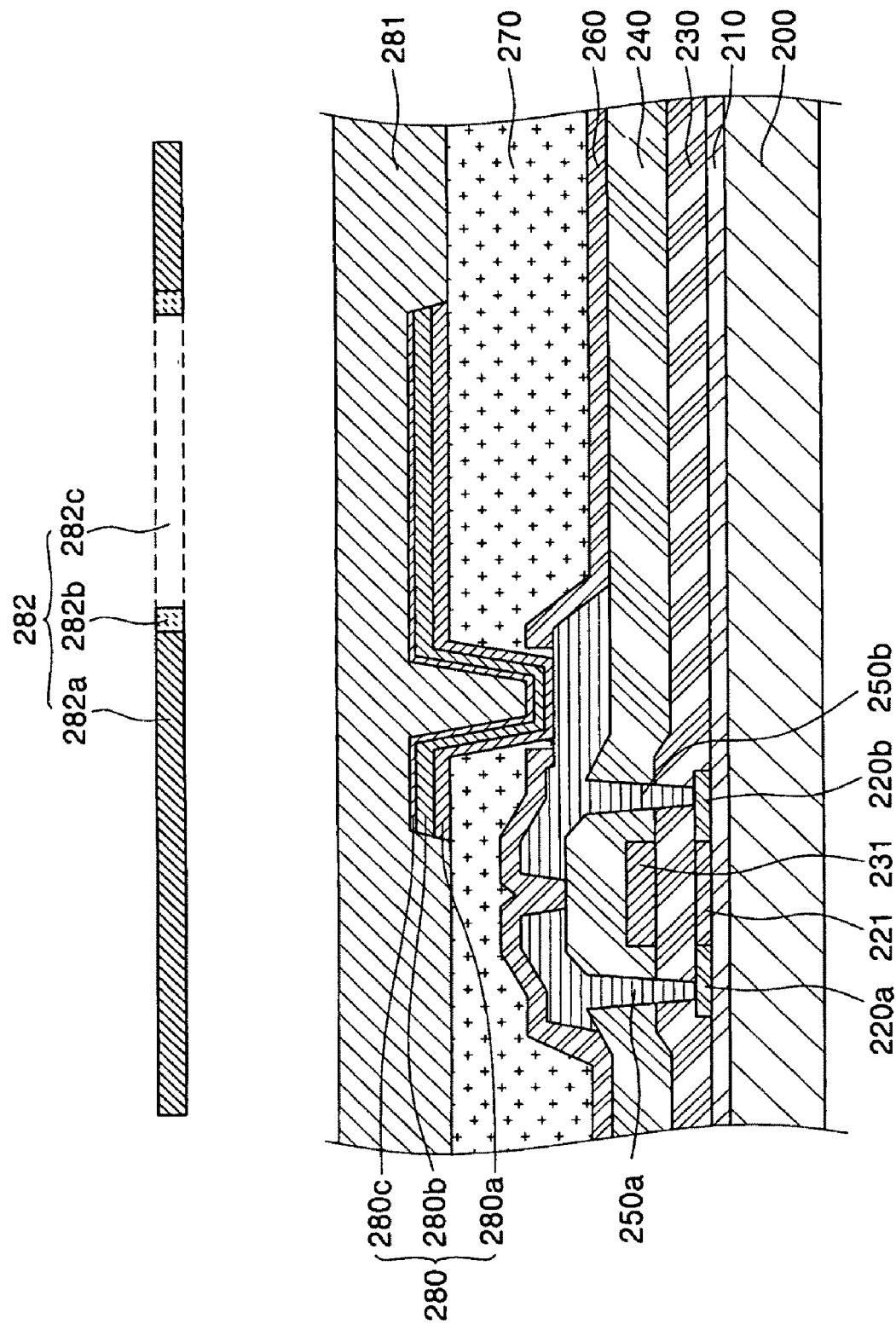

Referring to FIG. 4B, the photolithography and etching processes involve exposing the pixel defining layer 281 using a halftone mask 282.

The halftone mask 282 includes a light blocking region 282a, a semi-transmissive region 282b, and a transmissive region 282c. The light blocking region 282a completely blocks light, the semi-transmissive region 282b partially transmits light, and the transmissive region 282c wholly transmits light.

In this case, the structure of the halftone mask 282 may be varied according to a material of the pixel defining layer 281.

Specifically, referring to FIG. 4B, when the pixel defining layer 281 is formed of a positive material, a portion of the halftone mask 282 where the opening is formed is the transmissive region, a portion of the halftone mask 282 where the first region having the first level is formed is the semi-transmissive region, and a portion of the halftone mask 282 where the second region having the second level is formed is the light blocking region. Thus, a portion of the pixel defining layer 281, which is irradiated with light through the halftone mask 282, softens so that the irradiated portion may be removed during a subsequent developing process. Accordingly, a portion of the pixel defining layer 281 corresponding to the opening 281 is completely removed, a portion of the pixel defining layer 281 corresponding to the first region is partially removed, and a portion of the pixel defining layer 281 corresponding to the second region is not removed.

Although not shown in the drawings, when the pixel defining layer 281 is a negative material, a portion of the halftone mask 282 where the opening will be formed would be the light blocking region, a portion of the halftone mask 282 where the first region having the first level will be formed would be the semi-transmissive region, and a portion of the halftone mask 282 where the second region having the second level will be formed would be the transmissive region. Thus, a portion of the pixel defining layer 281, which is irradiated with light through the halftone mask 282, hardens so that an unirradiated portion may be removed during a subsequent developing process. Accordingly, a portion of the pixel defining layer 281 corresponding to the opening is completely removed, a portion of the pixel defining layer 281 corresponding to the first region is partially removed, and a portion of the pixel defining layer 281 corresponding to the second region is not removed.

Accordingly, the pixel defining layer 281 is exposed using the above-described halftone mask 282 so that the opening may be completely removed, the first region having the first level may be partially removed, and the second region having the second level may be preserved during a subsequent developing process. As a result, the first level will be disposed lower than the second level.

Referring to FIG. 4C, after the pixel defining layer 281 is exposed using the halftone mask 282, a plurality of spherical spacers 290a are applied onto the pixel defining layer 281.

Each of the spherical spacers may have a size of about 3 to 10 µm. When each of the spherical spacers has a size of less than 3 µm, the spacers may be too small to prevent or protect from damage to the pixel defining layer 281 due to inconsistencies or unevenness of a deposition mask during a subsequent process of depositing an organic layer. When each of the spherical spacers has a size of more than 10 µm, a second electrode or other layers formed on the pixel defining layer 281 may be unacceptably nonuniform due to the large size of the spherical spacers.

The spherical spacers 290a may be applied using, for example, a spacer sprayer 290. Although the spherical spacers 290a are illustrated as being sprayed at regular intervals for simplicity, the spherical spacers 290a are generally sprayed nonuniformly in practice.

After the spherical spacers 290a are applied, a bake process may be performed to fix the spherical spacers 290a to the pixel defining layer 281.

Figure 5A:
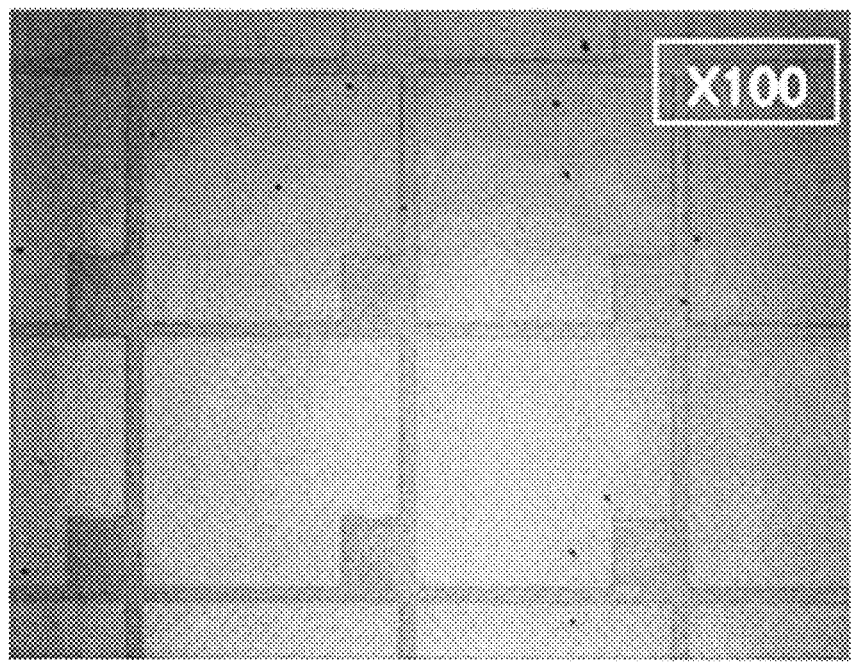
FIGS. 5A and 5B are photographs of a resultant structure before and after a developing process is performed without a bake process.
Figure 5B:
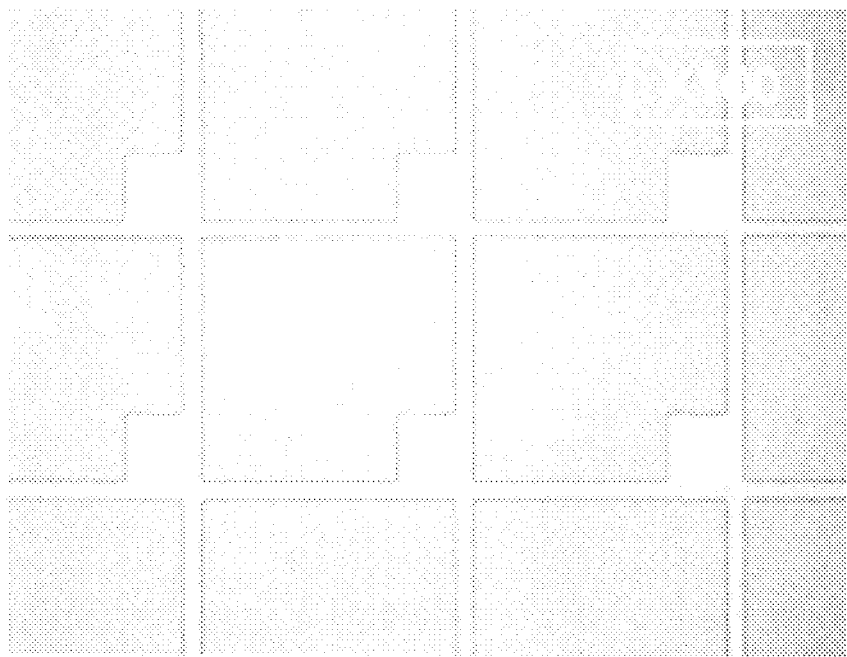

FIGS. 5A and 5B are photographs of a resultant structure before and after a developing process when a bake process is not performed.

Referring to FIG. 5A, before the developing process spherical spacers 290a were disposed on a pixel defining layer 281. However, as shown in FIG. 5B, after the developing process the spherical spacers 290a were lost from the surface of the pixel defining layer 281.

Figure 6A:
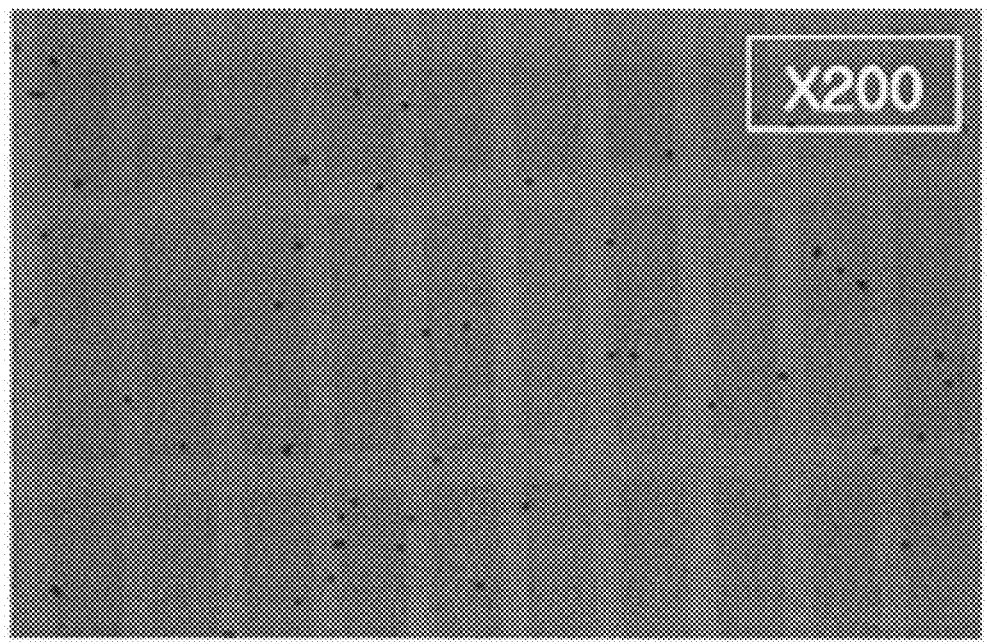
FIGS. 6A and 6B are photographs of a resultant structure before and after a developing process is performed including a bake process.
Figure 6B:
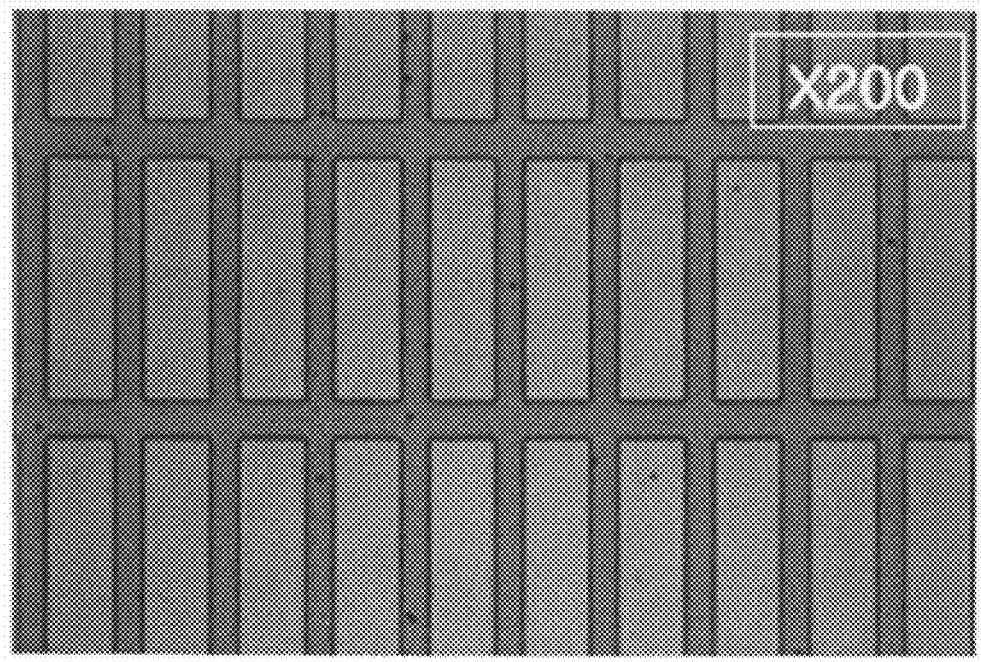

FIGS. 6A and 6B are photographs of a resultant structure before and after the developing process was performed after a bake process.

Referring to FIG. 6A, before the developing process, the spherical spacers 290a were disposed on the pixel defining layer 281. Referring to FIG. 6B, after a bake process, the developing process was performed, and the spherical spacers 290a were retained on the pixel defining layer 281.

According to an embodiment of the present invention, after the pixel defining layer 281 is exposed using the halftone mask 282, spherical spacers 290a are sprayed, and the opening and the first and second regions having the first and second levels are thereafter formed in the pixel defining layer 281 using the developing process. In this case, when the bake process is omitted after the spherical spacers 290a are sprayed, the spherical spacers 290a are lost during the developing process. When the bake process is performed after the spherical spacers 290a are sprayed, the spherical spacers 290a remain fixed to the surface of the pixel defining layer 281.

The bake process may be performed at temperatures of about 50 to 200° C. When the bake process is performed at temperatures below 50° C., the spherical spacers 290a may not be effectively fixed to the pixel defining layer 281. When the bake process is performed at temperatures above 200° C., a residual layer may remain on the pixel defining layer 281, possibly reducing the effectiveness of a later developing process.

Figure 4D:
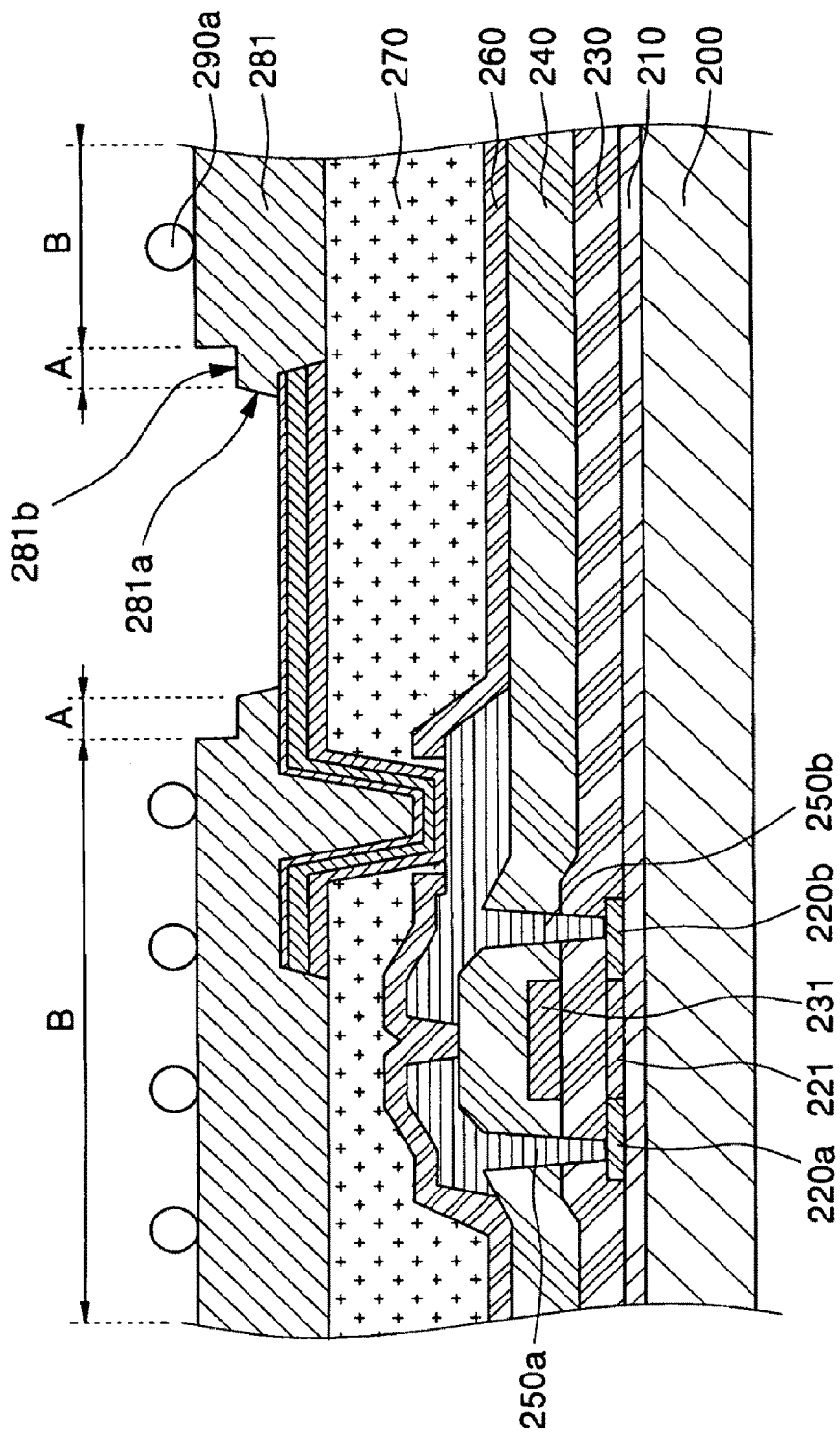

Referring to FIG. 4D, after the bake process is performed, the pixel defining layer 281 is developed to form an opening 281a and a nonopening in the pixel defining layer 281. The opening 281a exposes a portion of the first electrode 280 and defines an emission region, and the nonopening of the pixel defining layer 281 is divided into a first region having a first level A and a second region having a second level B.

As described above, when the pixel defining layer 281 is formed of a positive material, the formation of the opening 281a and the first and second regions having the first and second levels A and B includes removing the pixel defining layer 281 where the opening 281a is formed, and a portion of the pixel defining layer 281 where the first region having the first level is formed, and leaving a portion of the pixel defining layer 281 where the second region having the second level is retained.

When the pixel defining layer 281 is formed of a negative material, a similar structure is formed by generally irradiating the regions opposite the regions irradiated for the positive material.

In this case, the portion of the pixel defining layer 281 corresponding to the opening 281a is completely removed, exposing a portion of the first electrode 280 defining a pixel. A portion of the pixel defining layer 281 corresponding to the first region having the first level A is partially removed and disposed lower than a portion of the pixel defining layer 281 corresponding to the second region having the second level B.

During the removal of the portions of the pixel defining layer 281 corresponding to the opening 281a and the first region having the first level A, the spherical spacers 290a are removed from the portions of the pixel defining layer 281 corresponding to the opening 281a and the first region having the first level A. Thus, the spacers 290a formed in the second region having the second level B remain disposed on the pixel defining layer 281, but no spherical spacers are disposed on portions of the first electrode 280 exposed by the opening 281a and on portions 281b of the pixel defining layer 281 corresponding to the first region having the first level A.

In this case, the first region having the first level A is formed along an edge portion of the opening 281a.

In the present embodiment, the first region having the first level A is formed so that spherical spacers 290a are not disposed on the edge portion of the opening 281a.

If spherical spacers 290a are disposed on the edge portion of the opening 281a, the spherical spacers 290a may hinder a subsequent process of depositing an organic layer using a deposition mask, possibly causing a shadow phenomenon. In other words, an organic layer pattern may be formed to a nonuniform thickness and shape at an edge of the organic layer. Therefore, removal of spherical spacers 290a from the edge of the opening 281a is generally appropriate.

In this case, the width of the first region having the first level A may be at least ½ the size of each of the spherical spacers 290a. When the width of the first region having the first level A is smaller than ½ the size of each of the spherical spacers 290a, it may be more difficult to remove the spacers 290a from the edge portion of the opening 281a.

Also, the maximum width of the first region having the first level A may be appropriately controlled considering the width of the second region having the second level B on which the spacers 290a are retained. That is, the maximum width of the first region having the first level A may be controlled to be in the range in which the spherical spacers 290a may be disposed in the second region having the second level B.

In this case, the width of the first region having the first level A may be determined by controlling the width of the semi-transmissive region of the halftone mask 282.

Referring to FIG. 4E, an organic layer 291 having an emission layer (EML) is formed on the first electrode 280, and a second electrode 292 is formed on the organic layer 291.

The organic layer 291 having the EML is formed by a deposition apparatus using a deposition mask. In this case, when the organic layer 291 is formed using the deposition apparatus, even if the deposition mask is closely adhered to the substrate 200 having the pixel defining layer 281, the spherical spacers 290a maintain a spacing between the pixel defining layer 281 and the deposition mask, thereby preventing or reducing damage to the pixel defining layer 281 due to inconsistencies in the deposition mask.

In the above-described method of fabricating the OLED display device according to the present embodiment, the pixel defining layer 281 is formed on the first electrode 280. The regions where the opening 281a and the first and second regions having the first and second levels A and B will be formed are exposed using the halftone mask 282. Thereafter, the spherical spacers 290a are applied and fixed to the pixel defining layer 281 using a bake process. The pixel defining layer 281 is developed such that the spherical spacers 290a are retained on the second region having the second level B of the pixel defining layer 281. As a result, damage to the pixel defining layer 281 due to inconsistencies in the deposition mask during deposition of organic layer 291 can be prevented or reduced.

Also, the spherical spacers 290a are removed from the first region having the first level A. Thus, the occurrence of a shadow phenomenon, which may cause nonuniform formation of the organic layer pattern, can be prevented in edge portions of the organic layer 291 during the formation of the organic layer 291.

Accordingly, unlike in the conventional method of fabricating the OLED display device, according to the present embodiment, it is unnecessary to perform a photolithography process for forming a spacer pattern. As a result, the degradation of the OLED display device from residual spacer film remaining on a first electrode can be prevented or reduced. In addition, shadow phenomenon caused by nonuniform formation of the organic layer pattern in edge portions of the organic layer 291 can be inhibited.

The organic layer 291 includes the EML and may further include, for example, a hole injection layer (HIL), a hole transport layer (HTL), an electron transport layer (ETL), or an electron injection layer (EIL). The present invention is not limited to the construction and material of the organic layer 291.

The HTL may be formed of a hole transport material, such as N,N'-di(naphthalene-1-yl)-N,N'-diphenyl-benzidine (α-NPB) or N,N'-bis(3-methyl phenyl)-N,N'-dipheyl-[1,1'-biphenyl]4,4'-diamine (TPD). The HTL may be formed to a thickness of about 10 to 50 nm. When the HTL is formed to a thickness of less than 10 nm or more than 50 nm, the hole transport characteristic of the HTL may be compromised.

The HTL may further include a dopant that emits light due to a hole-electron combination process. The dopant may be, for example, 4-(dicyanomethylene)-2-t-butyl-6-(1,1,7,7-tetramethyljulolidyl-9-enyl)4H-pyran (DCJTB), Coumarin 6, rubrene, DCM, DCJTB, perylene, or quinacridone. The HTL may include 0.1 to 5% by weight of the dopant based on a total weight of the hole transport material. When the dopant is added to the HTL, the color of light emitted by the EML may be controlled according to the kind and content of the dopant, and the thermal stability of the HTL may be improved to increase the lifetime of the OLED display device.

The HIL may be formed of a starburst amine compound. The HIL may have a thickness of about 30 to 100 nm. When the HIL has a thickness of less than 30 nm or more than 100 nm, the hole injection characteristics of the HIL may be compromised. The HIL reduces contact resistance between an opposing electrode and the HTL and improves the hole transport capability of an anode, thereby improving the overall characteristics of the OLED display device.

The EML may be formed of, for example, 4,4'-bis(carbazol-9-yl)-biphenyl (CBP). However, the present invention is not limited to the material of the EML.

Like the HTL, the EML may further include a dopant that emits light due to a hole-electron combination process. In this case, the kind and content of the dopant added to an EML may be about the same as those of the dopant added to the HTL. The EML may have a thickness of about 10 to 40 nm.

The ETL may be formed of an electron transport material, such as tris(8-quinolinolate)-aluminium (Alq 3) or Almq 3. Like the HTL, the ETL may further include a dopant that emits light due to a hole-electron combination process. In this case, the kind and content of the dopant added to the ETL may be similar to those of the dopant added to the HTL. The ETL may have a thickness of about 30 to 100 nm. When the ETL has a thickness of less than 30 nm or more than 100 nm, the efficiency of the OLED display device may be compromised, and required driving voltages may be increased.

A hole blocking layer (HBL) may further be formed between the EML and the ETL. The HBL prevents the transport of excitons generated by a phosphorescent material to the ETL or prevents the transport of holes to the ETL. The HBL may be formed of, for example, BAlq.

The EIL may be formed of, for example, LiF to a thickness of about 0.1 to 10 nm. When the EIL has a thickness of less than 0.1 nm or more than 10 nm, required driving voltages may be increased.

When the OLED display device is a bottom-emitting type, the second electrode 292 formed on the organic layer 291 is embodied as a reflective electrode, which may be formed of, for example, Li, Ca, LiF/Ca, LiF/Al, Al, Mg, or an Mg alloy.

When the OLED display device is a top-emitting type, the second electrode 292 formed on the organic layer 291 is embodied as a semi-transmissive cathode or a stack structure obtained by sequentially stacking a semi-transmissive cathode and a transmissive cathode. The semi-transmissive cathode may be formed of, for example, Li, Ca, LiF/Ca, LiF/Al, Mg, or an Mg alloy to a thickness of about 5 to 30 nm. When the second electrode 292 is a stack structure, the semi-transmissive cathode may be a metal having a low work function, for example, Li, Ca, LiF/Ca, LiF/Al, Al, Mg, or an Mg alloy, and the transmissive cathode may be, formed on the semi-transmissive cathode using a low-resistance layer formed of, for example, indium tin oxide (ITO) or indium zinc oxide (IZO). In this case, when the semi-transmissive cathode has a thickness of less than 5 nm, electrons may not be injected at a low voltage. Also, when the semi-transmissive cathode has a thickness of more than 30 nm, the transmittance of the second electrode 292 may be markedly reduced. The total thickness of the semi-transmissive cathode and the transmissive cathode may range from 10 to 400 nm.

According to an embodiment of the present invention as described above, when the organic layer having the EML is formed using a deposition mask, spherical spacers are formed on the pixel defining layer, to prevent or reduce damage to the pixel defining layer due to inconsistencies or unevenness of the deposition mask. Therefore, a conventional process of forming a spacer pattern is not required.

Since the process of forming the spacer pattern is omitted, the number of photolithography processes may be reduced, and material costs may be saved.

Furthermore, since a process of patterning spacer film is eliminated, a residual layer of the spacer film is not left on the first electrode, preventing degradation of the OLED display device.

Moreover, the spherical spacers are removed from edge portions of the opening of the pixel defining layer to prevent the occurrence of a shadow phenomenon caused by nonuniform formation of the organic layer pattern in edge portions of the organic layer.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display device comprising:
a substrate;
a first electrode on the substrate;
a pixel defining layer on the first electrode, the pixel defining layer including an opening exposing the first electrode and a nonopening separated into a first region having a first level and a second region having a second level;
a plurality of spherical spacers on the second region of the pixel defining layer;
an organic layer on the first electrode and including an emission layer (EML); and
a second electrode on the organic layer,
wherein the first region is located along an edge portion of the opening, and
wherein the spherical spacers are directly on the pixel defining layer, and wherein the first level is lower than the second level.

2. The OLED display device according to claim 1, wherein the first region has a width at least ½ the size of each of the spherical spacers.

3. The OLED display device according to claim 1, wherein each of the spherical spacers has a size of about 3 to 10 μm.

4. The OLED display device according to claim 1, wherein the pixel defining layer comprises a material selected from the group consisting of polyacrylates resin, epoxy resin, phenolic resin, polyamides resin, polyimides resin, unsaturated polyesters resin, poly(phenylenethers) resin, poly(phenylenesulfides) resin, benzocyclobutene (BCB), and combinations thereof.

5. The OLED display device according to claim 1, wherein
the first electrode comprises a material selected from the group consisting of indium tin oxide (ITO), indium zinc oxide (IZO), tin oxide (TO), zinc oxide (ZnO), and combinations thereof, and
the second electrode comprises a material selected from the group consisting of Li, Ca, LiF/Ca, LiF/Al, Al, Mg, and combinations thereof.

6. The OLED display device according to claim 1, wherein
the first electrode includes a reflective layer and a transparent electrode on the reflective layer, the reflective layer comprising a material selected from the group consisting of Ag, Mg, Al, Pt, Pd, Au, Ni, Nd, Ir, Cr, and combinations thereof, and
the transparent electrode comprising a material selected from the group consisting of ITO, IZO, TO, and ZnO; and
wherein the second electrode comprises a material selected from the group consisting of Li, Ca, LiF/Ca, LiF/Al, Al, Mg, and an Mg alloy.

7. The OLED display device according to claim 1, wherein
the first electrode includes a lower electrode, a reflective electrode on the lower electrode, and an upper electrode on the reflective electrode,
the lower electrode comprising a material selected from the group consisting of ITO, IZO, TO, and ZnO,
the reflective electrode comprising a material selected from the group consisting of Ag, Mg, Al, Pt, Pd, Au, Ni, Nd, Ir, Cr, and combinations thereof, and
the upper electrode comprising a material selected from the group consisting of ITO, IZO, TO, and ZnO; and
wherein the second electrode comprises a material selected from the group consisting of Li, Ca, LiF/Ca, LiF/Al, Al, Mg, and an Mg alloy.

8. The OLED display device according to claim 1, further comprising a thin film transistor (TFT) on the substrate, the TFT including a semiconductor layer having source and drain regions, and source and drain electrodes electrically connected to the source and drain regions of the semiconductor layer, wherein the first electrode is connected to one of the source and drain electrodes.

9. A method of fabricating an organic light emitting diode (OLED) display device, comprising:
providing a substrate;
forming a first electrode on the substrate;
forming a pixel defining layer on the first electrode;
applying a plurality of spherical spacers on the pixel defining layer;
forming an opening in the pixel defining layer partially exposing the first electrode and a nonopening separated into a first region having a first level and a second region having a second level on the pixel defining layer;
forming an organic layer having an emission layer (EML) on the first electrode; and
forming a second electrode on the organic layer,
wherein the first region is formed along an edge portion of the opening, wherein the spherical spacers are directly on the pixel defining layer, and wherein the first level is lower than the second level.

10. The method according to claim 9, further comprising, after forming the pixel defining layer, exposing the pixel defining layer to light to form the opening and the first and second regions in the pixel defining layer.

11. The method according to claim 10, wherein the exposing the pixel defining layer to light is performed by utilizing a halftone mask.

12. The method according to claim 11,
wherein the halftone mask includes a light blocking region, a semi-transmissive region, and a transmissive region, and
wherein when the pixel defining layer is formed of a positive material, the opening corresponds to the transmissive region, the first region corresponds to the semi-transmissive region, and the second region corresponds to the light blocking region.

13. The method according to claim 11,
wherein the halftone mask includes a light blocking region, a semi-transmissive region, and a transmissive region, and
wherein when the pixel defining layer is formed of a negative material, the opening corresponds to the light blocking region, the first region corresponds to the semi-transmissive region, and the second region corresponds to the transmissive region.

14. The method according to claim 9, further comprising, after applying the spherical spacers, baking the substrate with the spherical spacers.

15. The method according to claim 14, wherein the baking the substrate includes exposing the substrate to temperatures of about 50 to 200° C.

16. The method according to claim 9, further comprising forming a thin film transistor (TFT) including a semiconductor layer having source and drain regions and source and drain electrodes electrically connected to the source and drain regions of the semiconductor layer, wherein the first electrode is connected to one of the source and drain electrodes.

* * * * *